United States Patent
Lin et al.

(10) Patent No.: US 10,043,774 B2
(45) Date of Patent: Aug. 7, 2018

(54) INTEGRATED CIRCUIT PACKAGING SUBSTRATE, SEMICONDUCTOR PACKAGE, AND MANUFACTURING METHOD

(71) Applicant: TAIWAN SEMICONDUCTOR MANUFACTURING CO., LTD., Hsinchu (TW)

(72) Inventors: Yu-Wei Lin, New Taipei (TW); Chen-Shien Chen, Zhubei (TW); Guan-Yu Chen, Hsinchu (TW); Tin-Hao Kuo, Hsinchu (TW); Yen-Liang Lin, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/622,529

(22) Filed: Feb. 13, 2015

(65) Prior Publication Data

US 2016/0240502 A1   Aug. 18, 2016

(51) Int. Cl.
*H01L 23/00* (2006.01)
*H01L 23/498* (2006.01)
*H01L 21/66* (2006.01)

(52) U.S. Cl.
CPC ............ *H01L 24/16* (2013.01); *H01L 22/12* (2013.01); *H01L 23/49811* (2013.01);
(Continued)

(58) Field of Classification Search
CPC ......... H01L 24/07; H01L 24/09; H01L 24/16; H01L 24/81; H01L 21/4853; H01L 22/12; H01L 23/49811; H01L 23/49838; H01L 23/49894; H01L 24/13; H01L 2224/131; H01L 2224/16105; H01L 2224/16227;
(Continued)

(56) References Cited

U.S. PATENT DOCUMENTS

| | | | |
|---|---|---|---|
| 2011/0127657 A1* | 6/2011 | Oda | H01L 21/6835 257/668 |
| 2012/0018904 A1* | 1/2012 | Lin | H01L 21/4857 257/782 |

(Continued)

FOREIGN PATENT DOCUMENTS

| | | |
|---|---|---|
| TW | 201011879 A | 3/2010 |
| TW | 201227901 A | 7/2012 |

*Primary Examiner* — Cheung Lee
*Assistant Examiner* — Stephen C Smith
(74) *Attorney, Agent, or Firm* — Maschoff Brennan

(57) ABSTRACT

An integrated circuit (IC) packaging substrate includes a main body, at least one first conductive line, at least one second conductive line, and at least one protrusion pad. The first conductive line is embedded in the main body. The second conductive line is embedded in the main body. The protrusion pad is disposed on the first conductive line. The protrusion pad protrudes from the main body and is configured to be in electrical contact with a solder portion of a semiconductor chip. A first spacing between the protrusion pad and the second conductive line is determined in accordance with a process deviation of the protrusion pad by the width of the protrusion pad and the width of the first conductive line. Moreover, a semiconductor package having the IC packaging substrate and a manufacturing method of the semiconductor package are also provided.

20 Claims, 5 Drawing Sheets

100

(52) U.S. Cl.
CPC ........ *H01L 23/49827* (2013.01); *H01L 24/81* (2013.01); *H01L 24/13* (2013.01); *H01L 2224/131* (2013.01); *H01L 2224/16105* (2013.01); *H01L 2224/16227* (2013.01); *H01L 2224/16238* (2013.01); *H01L 2224/8138* (2013.01); *H01L 2224/81815* (2013.01); *H01L 2924/14* (2013.01); *H01L 2924/381* (2013.01); *H01L 2924/3841* (2013.01)

(58) Field of Classification Search
CPC ... H01L 2224/16238; H01L 2224/8138; H01L 2224/81815; H01L 2924/14; H01L 2924/381; H01L 2924/3841
See application file for complete search history.

(56) References Cited

U.S. PATENT DOCUMENTS

| | | | |
|---|---|---|---|
| 2012/0305916 A1* | 12/2012 | Liu .................. | H01L 22/34 257/48 |
| 2013/0069221 A1* | 3/2013 | Lee .................. | H01L 23/49811 257/737 |
| 2014/0191390 A1* | 7/2014 | Chuang .................. | H01L 24/05 257/737 |
| 2014/0266549 A1* | 9/2014 | Huang .................. | H01F 27/2804 336/200 |
| 2015/0318256 A1* | 11/2015 | Chang .................. | H01L 24/17 257/737 |
| 2016/0190079 A1* | 6/2016 | Liao .................. | H01L 24/13 257/737 |

* cited by examiner

100c

200c

INTEGRATED CIRCUIT PACKAGING SUBSTRATE, SEMICONDUCTOR PACKAGE, AND MANUFACTURING METHOD

BACKGROUND

Along with the progress and development in integrated circuits (ICs), the package size has been reduced from dual in-line packages (DIPs) to flatpacks, to leadless chip carriers (LCCs), and to chip-scale packages (CSPs). Analog and digital integrated circuit types are available in DIPs. For example, DIPs may be used in resistor packs, switches, light-emitting diode (LED) segmented and bar graph displays, and electromechanical relays. DIPs are also used with breadboards, a temporary mounting arrangement for education, design development or device testing.

However, semiconductor packages have been continuously improved to meet new demands for high-performance, small-size, and high-speed electronic devices. In order to package more electronic components in a limited space of an electronic device, the package size have become smaller and smaller. Electronic devices, such as smart phones and tablet computers, may be miniaturized through using CSPs as their electronic components. CSPs may be classified into the following groups: customized leadframe-based CSP (LFCSP), flexible substrate-based CSP, flip-chip CSP (FCCSP), rigid substrate-based CSP, and wafer-level redistribution CSP (WL-CSP). In addition, flip chip (FC) is a type of CSPs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
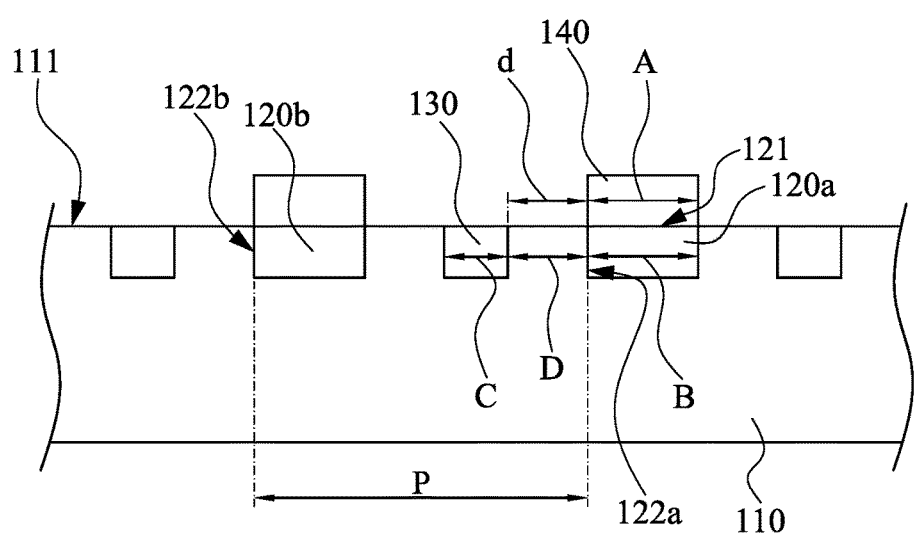
FIG. 1 is a cross-sectional view of an integrated circuit (IC) packaging substrate according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

Flip chip is a type of CSPs. When a flip chip is manufactured, solder balls are disposed on a top surface of a silicon chip. Thereafter, the flip chip is flipped over, and the top surface of the flip chip faces an integrated circuit (IC) packaging substrate, such that the solder balls on the top surface of the flip chip may be aligned with pads on the IC packaging substrate. When the flip chip is mounted to the IC packaging substrate, the solder balls may be reflowed to complete the interconnection between the flip chip and the IC packaging substrate. The IC packaging substrate may be a coreless substrate that has no rigid core layer. Hence, the coreless substrate is easily treated to reduce via pitches, such that the coreless substrate has advantages of small joint pitches, fine patterning, and good transmission property. As a result, the density of conductive joints of a semiconductor chip and the density of conductive joints of the IC packaging substrate may be increased. However, the warpage of the IC packaging substrate may be prone to occur due to insufficient mechanical strength. Once the warpage of the IC packaging substrate is induced, a poor solder connection between the semiconductor chip and the IC packaging substrate will be formed. Therefore, the assembly yield between the semiconductor chip and the IC packaging substrate may not be effectively improved.

FIG. 1 is a cross-sectional view of an integrated circuit (IC) packaging substrate 100 according to some embodiments of the present disclosure. The IC packaging substrate 100 includes a main body 110, at least one first conductive line 120a, at least one second conductive line 130, and at least one protrusion pad 140. The first conductive line 120a is embedded in the main body 110. The second conductive line 130 adjacent to the first conductive line 120a is embedded in the main body 110. The protrusion pad 140 is disposed on the first conductive line 120a and protrudes from the main body 110. A first spacing d between the protrusion pad 140 and the second conductive line 130 is determined in accordance with a process deviation of the protrusion pad 140 by the width A of the protrusion pad 140 and the width B of the first conductive line 120a.

The first and second conductive lines 120a, 130 are referred to as two adjacent rows of conductive lines of the IC packaging substrate 100, and the first conductive line 120a is not electrically connected to the second conductive lines 130. If the first conductive line 120a is electrically connected to the second conductive line 130 (e.g., a pad bridge or a solder bridge), a short circuit will be formed.

In some embodiment, the process deviation of the protrusion pad 140 may be about 10 µm, and the first spacing d determined by the width A of the protrusion pad 140 and the width B of the first conductive line 120a may be greater than about 5 µm. Through such a configuration, the first spacing d is wide enough to prevent a pad bridge caused by a shift protrusion pad 140 that is in electrical contact with both of the first and second conductive lines 120a, 130, such that the yield of the IC packaging substrate 100 is improved.

Moreover, the protrusion pad 140 is configured to be in electrical contact with a solder portion of a semiconductor chip. When the semiconductor chip is bonded to the IC packaging substrate 100, the first spacing d is also wide enough to prevent a solder bridge caused by the solder portion that is in electrical contact with both of a shift protrusion pad 140 and the second conductive line 130.

Figure 2:
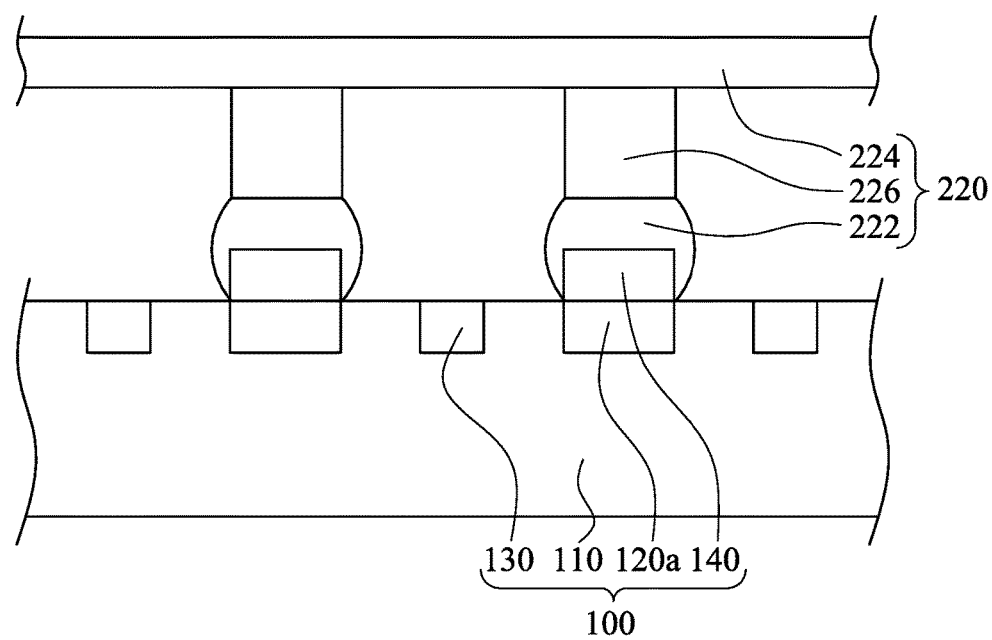
FIG. 2 is a cross-sectional view of a semiconductor package having the IC packaging substrate shown in FIG. 1.

FIG. 2 is a cross-sectional view of a semiconductor package 200 having the IC packaging substrate 100 shown in FIG. 1. As shown in FIG. 1 and FIG. 2, the semiconductor package 200 includes the IC packaging substrate 100 and a semiconductor chip 220. At least a portion of the orthogonal projection of the protrusion pad 140 on the main body 110 overlaps the orthogonal projection of the first conductive line 120a on the main body 110. The semiconductor chip 220 is bonded to the IC packaging substrate 100 and has the solder portion 222 that is in electrical contact with the protrusion pad 140 of the IC packaging substrate 100. The width A of the protrusion pad 140 and the width B of the first conductive line 120a are determined to form the first spacing d between the protrusion pad 140 and the second conductive line 130.

The contact area between the IC packaging substrate 100 and the semiconductor chip 220 is increased through the protrusion pad 140 that is in electrical contact with the solder portion 222. As a result, even if the warpage of the IC packaging substrate 100 is prone to occur due to insufficient mechanical strength, the solder portion 222 of the semiconductor chip 220 may still be firmly connected to the protrusion pad 140, such that the assembly yield between the IC packaging substrate 100 and the semiconductor chip 220 is improved.

In some embodiment, the protrusion pad 140 shown in FIG. 1 has no process deviation, such that the protrusion pad 140 is aligned with the first conductive line 120a. The width A of the protrusion pad 140 is substantially equal to the width B of the first conductive line 120a. It is to be noted that "substantially" used herein may refer to variances occurring due to manufacturing errors, such as a 10% error, but the present disclosure is not limited in this regard.

Moreover, the width C of the second conductive line 130 is smaller than or substantially equal to the width B of the first conductive line 120a. A second spacing D is formed between the second conductive line 130 and the first conductive line 120a. The second spacing D is smaller than or substantially equal to the width B of the first conductive line 120a.

In addition, the IC packaging substrate 100 may further include another first conductive line 120b, and the second conductive line 130 is located between the first conductive lines 120a, 120b. A pitch P is formed between the first conductive lines 120a, 120b. In some embodiments, the pitch P may be defined by a sidewall 122a of the first conductive line 120a and a corresponding sidewall 122b of the first conductive line 120b. The first conductive lines 120a, 120b, the second conductive line 130, and the protrusion pad 140 may be formed by photolithography, such as exposure process, development process, and etching process.

Moreover, the main body 110 of the IC packaging substrate 100 has a first surface 111, the first conductive line 120a has a second surface 121, and the first and second surfaces 111, 121 are substantially at the same level. The main body 110 of the IC packaging substrate 100 may be made of a material including glass fiber and polypropylene, but the present disclosure is not limited in this regard.

The semiconductor chip 220 further includes a semiconductor substrate 224 and a conductive bump 226. The conductive bump 226 is connected to the semiconductor substrate 224 and the solder portion 222. The semiconductor substrate 224 may be a thin slice of semiconductor material, such as a silicon crystal, used in the fabrication of integrated circuits and other microelectronic devices. The semiconductor substrate 224 may undergo micro fabrication processes, such as chemical vapor deposition (CVD) process, physical vapor deposition (PVD) process, and patterning process.

It is to be noted that the connection relationships and the materials of the components described above will not be repeated in the following description, and only aspects related to other types of IC packaging substrates will be described.

Figure 3:
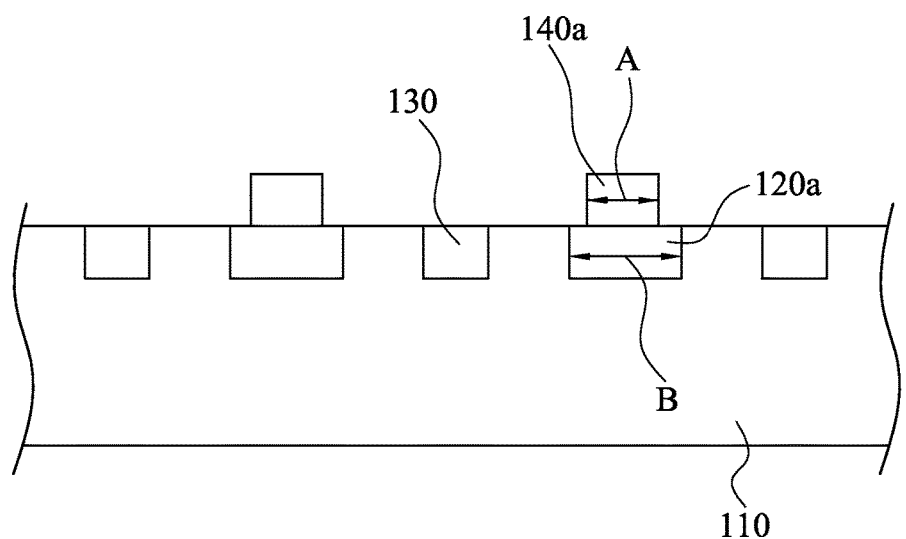
FIG. 3 is a cross-sectional view of an IC packaging substrate according to some embodiments of the present disclosure.

FIG. 3 is a cross-sectional view of an IC packaging substrate 100a according to some embodiments of the present disclosure. The IC packaging substrate 100a includes the main body 110, the first conductive line 120a, the second conductive line 130, and the protrusion pad 140a. The difference between this embodiment and the embodiment shown in FIG. 1 is that the width A of the protrusion pad 140a is smaller than the width B of the first conductive line 120a.

In some embodiments, the protrusion pad 140a has no process deviation, such that the protrusion pad 140a is aligned with the first conductive line 120a.

Figure 4:
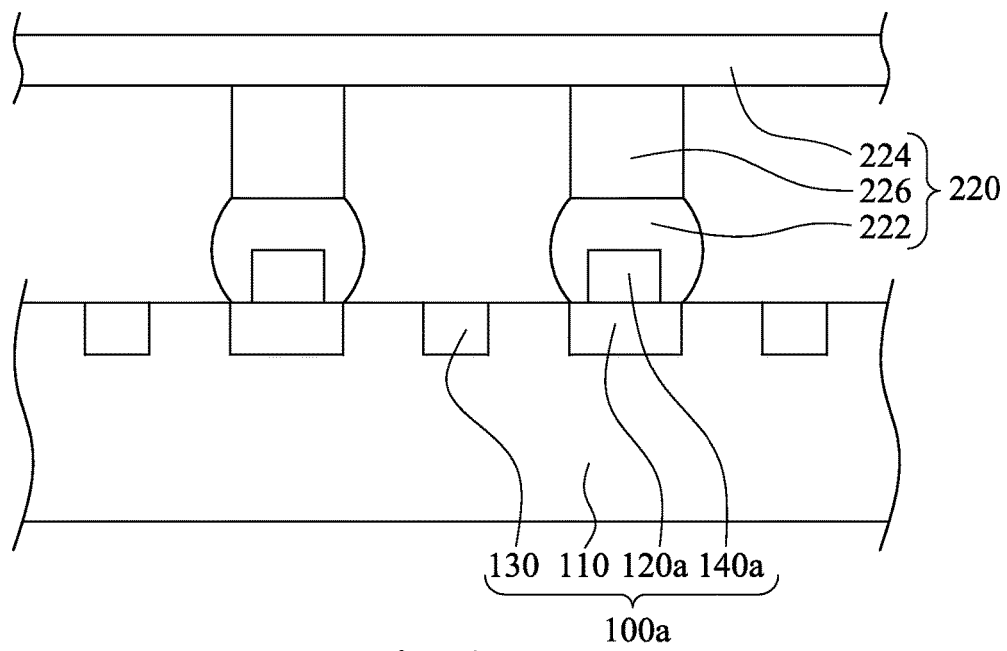
FIG. 4 is a cross-sectional view of a semiconductor package having the IC packaging substrate shown in FIG. 3.

FIG. 4 is a cross-sectional view of a semiconductor package 200a having the IC packaging substrate 100a shown in FIG. 3. As shown in FIG. 3 and FIG. 4, since the protrusion pad 140a is located on the first conductive line 120a and protrudes from the main body 110, the contact area between the IC packaging substrate 100a and the semiconductor chip 220 is increased through the protrusion pad 140a that is in electrical contact with the solder portion 222. When the warpage of the IC packaging substrate 100a occurs due to insufficient mechanical strength, the solder portion 222 of the semiconductor chip 220 may still be firmly connected to the protrusion pad 140a. As a result, the assembly yield between the IC packaging substrate 100a and the semiconductor chip 220 may be improved.

Figure 5:
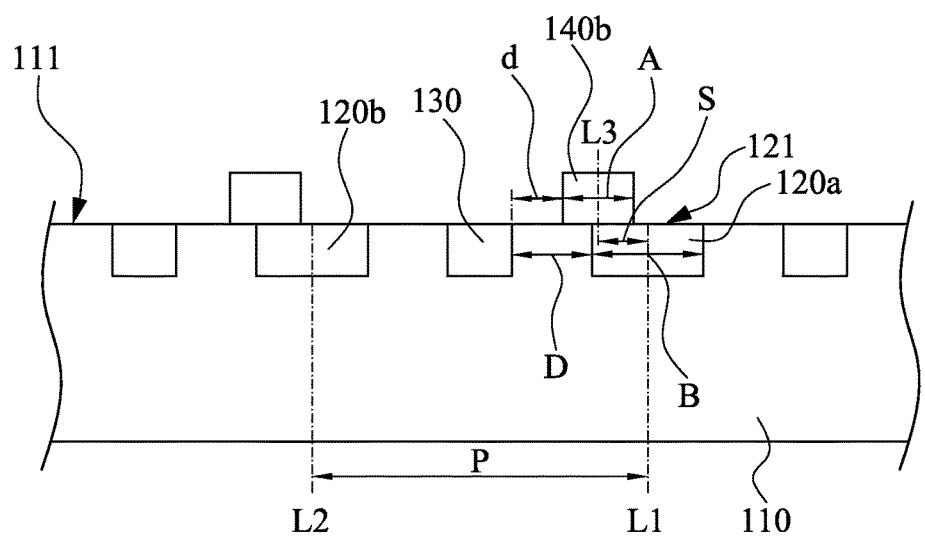
FIG. 5 is a cross-sectional view of an IC packaging substrate according to some embodiments of the present disclosure.

FIG. 5 is a cross-sectional view of an IC packaging substrate 100b according to some embodiments of the present disclosure. The IC packaging substrate 100b includes the main body 110, the first conductive lines 120a, 120b, the second conductive line 130, and the protrusion pad 140b. The second spacing D is formed between the second conductive line 130 and the first conductive line 120a, and the pitch P is formed between the first conductive lines 120a, 120b. In some embodiments, the pitch P may be defined by the central line L1 of the first conductive line 120a and the central line L2 of the first conductive line 120b.

The difference between this embodiment and the embodiment shown in FIG. 3 is that the protrusion pad 140b has a process deviation, such that the central line L3 of the protrusion pad 140b and the central line L1 of the first conductive line 120a are spaced from each other at a shift S. Moreover, a portion of the protrusion pad 140b is located on the first surface 111 of the main body 110, and another portion of the protrusion pad 140b is located on the second surface 121 of the first conductive line 120a. Hence, the protrusion pad 140b remains in electrical contact with the first conductive line 120a.

Figure 6:
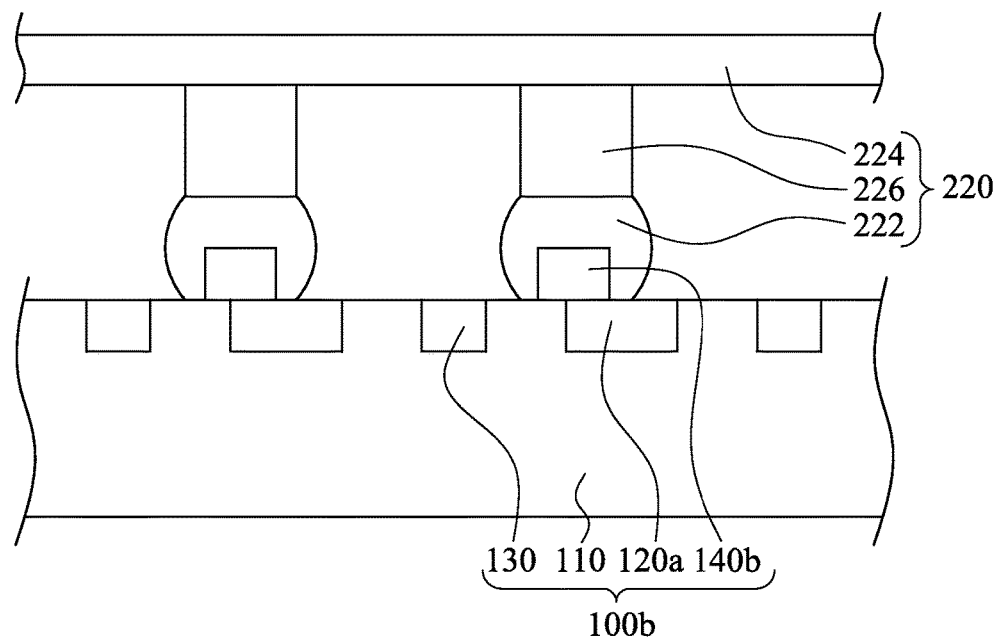
FIG. 6 is a cross-sectional view of a semiconductor package having the IC packaging substrate shown in FIG. 5.

FIG. 6 is a cross-sectional view of a semiconductor package 200b having the IC packaging substrate 100b shown in FIG. 5. As shown in FIG. 5 and FIG. 6, when the pitch P and the second spacing D substantially satisfy the inequality D≥P/4, the width A of the protrusion pad 140b and the width B of the first conductive line 120a substantially satisfy the inequality 0<A/B≤0.75. Designers may determine a suitable width A of the protrusion pad 140b and a suitable width B of the first conductive line 120a to substantially satisfy the aforesaid inequality.

As a result of such a design, the predetermined width A of the protrusion pad 140b and the predetermined width B of the first conductive line 120a may prevent the solder portion 222 from electrically contacting the second conductive line 130 and may prevent the protrusion pad 140b from electrically contacting the second conductive line 130. Therefore, solder bridges, pad bridges, and short circuits are not apt to occur in the semiconductor package 200b of the present disclosure, and the assembly yield between the IC packaging substrate 100b and the semiconductor chip 220 and the yield of the IC packaging substrate 100b are improved.

Figure 7:
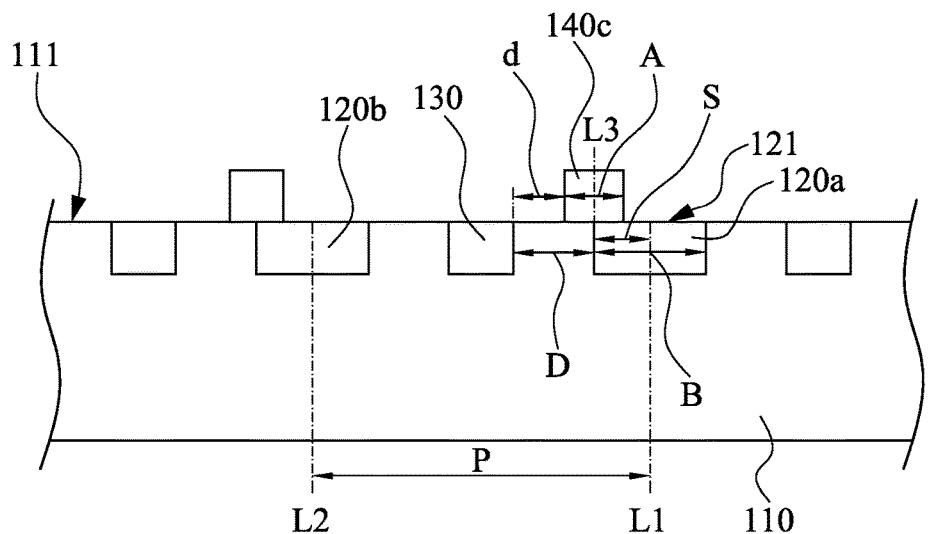
FIG. 7 is a cross-sectional view of an IC packaging substrate according to some embodiments of the present disclosure.
Figure 8:
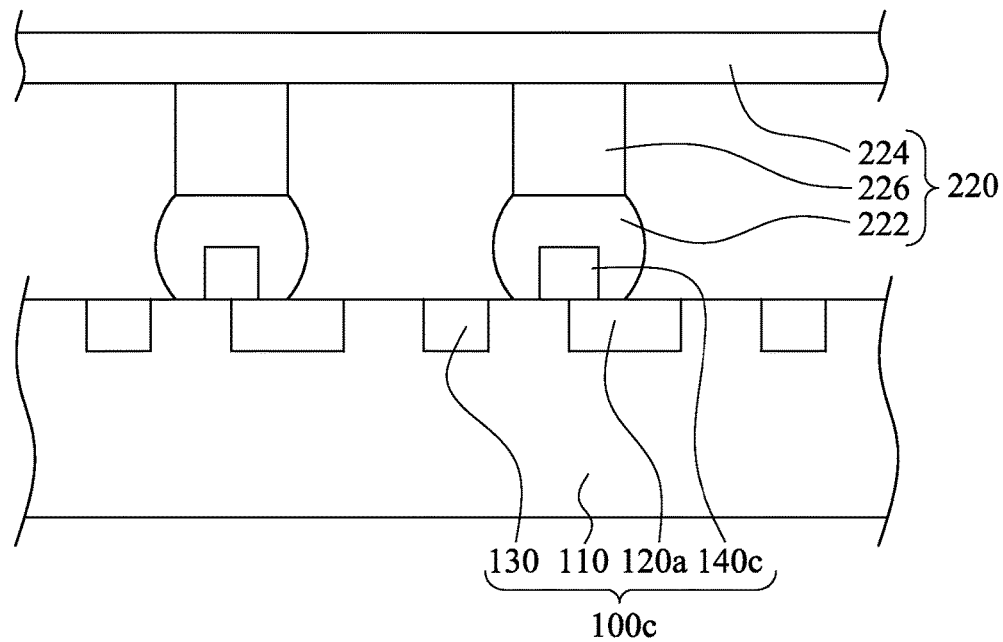
FIG. 8 is a cross-sectional view of a semiconductor package having the IC packaging substrate shown in FIG. 7.

FIG. 7 is a cross-sectional view of an IC packaging substrate 100c according to some embodiments of the present disclosure. FIG. 8 is a cross-sectional view of a semiconductor package 200c having the IC packaging substrate 100c shown in FIG. 7. As shown in FIG. 7 and FIG. 8, the IC packaging substrate 100c includes the main body 110, the first conductive lines 120a, 120b, the second conductive line 130, and the protrusion pad 140c. The second spacing D is formed between the second conductive line 130 and the first conductive line 120a, and the pitch P is formed between the first conductive lines 120a, 120b. In some embodiments, the pitch P may be defined by the central line L1 of the first conductive line 120a and the central line L2 of the first conductive line 120b. The difference between this embodiment and the embodiment shown in FIG. 3 is that the protrusion pad 140c has a process deviation, such that the central line L3 of the protrusion pad 140c and the central line L1 of the first conductive line 120a are spaced from each other at a shift S.

When the pitch P and the second spacing D substantially satisfy the inequality 10 μm≤D<P/4, the width A of the protrusion pad 140c and the width B of the first conductive line 120a substantially satisfy the inequality 0<A/B≤0.45. Designers may determine a suitable width A of the protrusion pad 140c and a suitable width B of the first conductive line 120a to substantially satisfy the aforesaid inequality.

As a result of such a design, the predetermined width A of the protrusion pad 140c and the predetermined width B of the first conductive line 120a may prevent the solder portion 222 from electrically contacting the second conductive line 130 and may prevent the protrusion pad 140c from electrically contacting the second conductive line 130. Therefore, solder bridges, pad bridges, and short circuits are not apt to occur in the semiconductor package 200c of the present disclosure, and the assembly yield between the IC packaging substrate 100c and the semiconductor chip 220 and the yield of the IC packaging substrate 100c are improved.

In the following description, a manufacturing method of a semiconductor package will be described.

Figure 9:
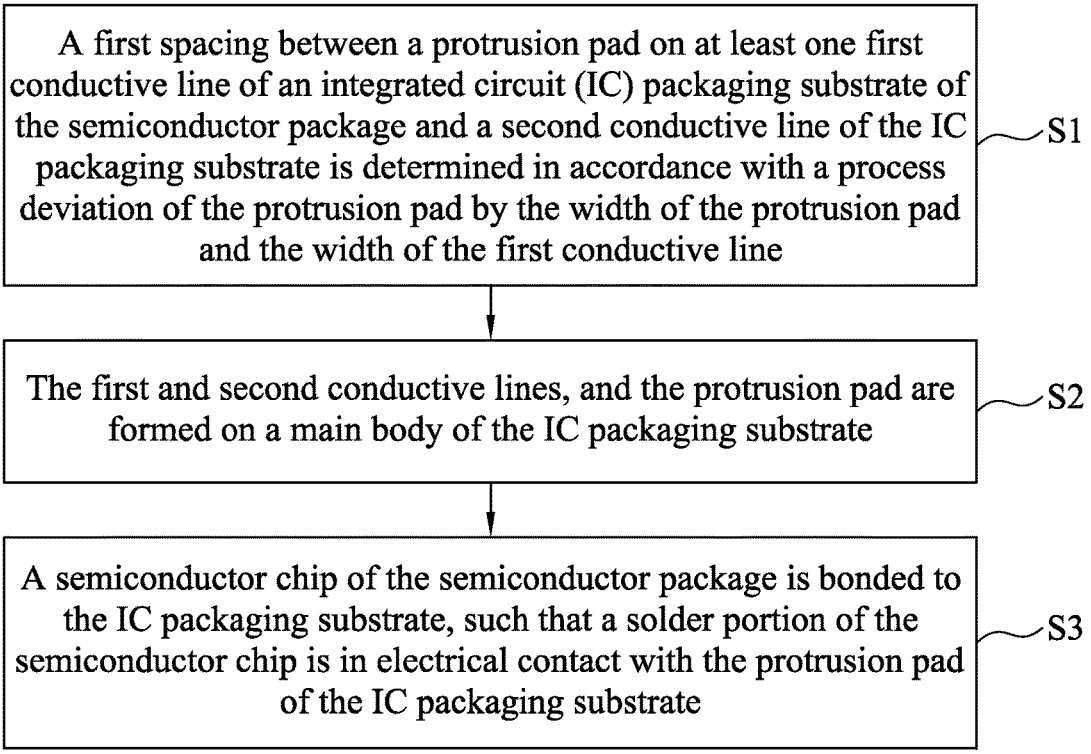
FIG. 9 is a flow chart of a manufacturing method of a semiconductor package according to some embodiments of the present disclosure.

FIG. 9 is a flow chart of a manufacturing method of a semiconductor package according to some embodiments of the present disclosure. In step S1, a first spacing between a protrusion pad on at least one first conductive line of an integrated circuit (IC) packaging substrate of the semiconductor package and a second conductive line of the IC packaging substrate is determined in accordance with a process deviation of the protrusion pad by the width of the protrusion pad and the width of the first conductive line.

In some embodiments, a pitch P between at least two of the first conductive lines and a second spacing D between the second conductive line and one of the first conductive lines may be measured. Afterwards, the pitch P and the second spacing D may be judged to substantially satisfy one of the inequalities D≥P/4 or 10 μm≤D<P/4. When the pitch P and the second spacing D substantially satisfy the inequality D≥P/4, the width A of the protrusion pad and the width B of each of the first conductive lines may be determined by designers to substantially satisfy the inequality 0<A/B≤0.75. Alternatively, When the pitch P and the second spacing D substantially satisfy the inequality 10 μm≤D<P/4, the width A of the protrusion pad and the width B of each of the first conductive lines may be determined by designers to substantially satisfy the inequality 0<A/B≤0.45. Designers may use the determined width A and the determined width B to respectively form the protrusion pad and the first conductive lines.

Thereafter in step S2, The first and second conductive lines, and the protrusion pad are formed on a main body of the IC packaging substrate. When the first and second conductive lines, and the protrusion pad are formed on the main body of the IC packaging substrate, a photolithography process may be performed on the first and second conductive lines, and the protrusion pad, but the present disclosure is not limited to the photolithography process. For example, an electroplating process may be utilized to form the first and second conductive lines, and the protrusion pad.

Finally in Step 3, a semiconductor chip of the semiconductor package is bonded to the IC packaging substrate, such that a solder portion of the semiconductor chip is in electrical contact with the protrusion pad of the IC packaging substrate. When the semiconductor chip is bonded to the IC packaging substrate, a reflow treatment may be performed on the semiconductor chip and the IC packaging substrate. After a solder portion of the semiconductor chip is in electrical contact with the protrusion pad of the IC packaging substrate through the reflow treatment, the semiconductor package of the present disclosure may be obtained, such as the semiconductor packages shown in FIGS. 2, 4, 6, and 8.

In order to prevent the warpage of an IC packaging substrate reducing the assembly yield between the IC packaging substrate and a semiconductor chip and the yield of the IC packaging substrate, a protrusion pad on a first line of the IC packaging substrate is configured to be in electrical contact with a solder portion of the semiconductor chip, and the width of the protrusion pad and the width of the first conductive line are designed to determine a first spacing between the protrusion pad and a second conductive line next to the first conductive line in accordance with a process deviation of the protrusion pad. When the semiconductor chip is bonded to the IC packaging substrate having the protrusion pad, the solder portion of the semiconductor chip is firmly connected to the protrusion pad due to increased contact area. Moreover, the predetermined width of the protrusion pad and the predetermined width of the first conductive line prevent the solder portion from electrically contacting the second conductive line and prevent the protrusion pad from electrically contacting the second conductive line. As a result, solder bridges, pad bridges, and short circuits are not apt to occur in the semiconductor package of the present disclosure, such that the assembly yield between the IC packaging substrate and the semiconductor chip and the yield of the IC packaging substrate are improved.

According to some embodiments, an integrated circuit (IC) packaging substrate includes a main body, at least one first conductive line, at least one second conductive line, and at least one protrusion pad. The first conductive line is embedded in the main body. The second conductive line is embedded in the main body. The protrusion pad is disposed on the first conductive line. The protrusion pad protrudes from the main body and is configured to be in electrical contact with a solder portion of a semiconductor chip. A first spacing between the protrusion pad and the second conductive line is determined in accordance with a process deviation of the protrusion pad by the width of the protrusion pad and the width of the first conductive line.

According to some embodiments, a semiconductor package includes an integrated circuit (IC) packaging substrate and a semiconductor chip. The integrated circuit (IC) packaging substrate includes a main body, at least one first conductive line, and at least one protrusion pad. The first conductive line is embedded in the main body. The second conductive line is embedded in the main body. The protrusion pad protrudes from the main body. At least a portion of the orthogonal projection of the protrusion pad on the main body overlaps the orthogonal projection of the first conductive line on the main body. The semiconductor chip is bonded to the IC packaging substrate and has a solder portion that is in electrical contact with the protrusion pad. The width of the protrusion pad and the width of the first conductive line are determined to form a first spacing between the protrusion pad and the second conductive line.

According to some embodiments, a manufacturing method of a semiconductor package includes the following steps. A first spacing between a protrusion pad on at least one first conductive line of an integrated circuit (IC) packaging substrate of the semiconductor package and a second conductive line of the IC packaging substrate is determined in accordance with a process deviation of the protrusion pad by the width of the protrusion pad and the width of the first conductive line. The first and second conductive lines, and the protrusion pad are formed on a main body of the IC packaging substrate. A semiconductor chip of the semiconductor package is bonded to the IC packaging substrate, such that a solder portion of the semiconductor chip is in electrical contact with the protrusion pad of the IC packaging substrate.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) packaging substrate, comprising:
a main body;
at least one first conductive line embedded in the main body with a top surface of the at least one first conductive line exposed therefrom;
a second conductive line embedded in the main body with a top surface of the second conductive line exposed therefrom; and a protrusion pad disposed protectively above and in electrical contact with the first conductive line, wherein the protrusion pad protrudes above a top surface of the main body and is configured to interface a solder portion of a semiconductor chip, an orthogonal projection of the protrusion pad on the main body is spaced from the second conductive line, and 0<A/B≤0.75, where A is a width of the protrusion pad, and B is a width of the at least one first conductive line.

2. The IC packaging substrate of claim 1, wherein a pitch P between at least two of the first conductive lines and a spacing D between the second conductive line and one of the first conductive lines substantially satisfy the following inequality:

$$D \geq P/4.$$

3. The IC packaging substrate of claim 1, wherein a width of the second conductive line is smaller than or substantially equal to a width of the first conductive line.

4. The IC packaging substrate of claim 1, wherein a spacing between the second conductive line and the first conductive line is smaller than or substantially equal to a width of the first conductive line.

5. The IC packaging substrate of claim 1, wherein the top surface of the main body and the top surface of the first conductive line are at the same level.

6. The IC packaging substrate of claim 5, wherein a portion of the protrusion pad is located on the top surface of the main body, and another portion of the protrusion pad is located on the top surface of the first conductive line.

7. The IC packaging substrate of claim 1, wherein the main body is made of a material comprising glass fiber and polypropylene.

8. The integrated circuit packaging substrate of claim 1, wherein the second conductive line is free from coverage by the protrusion pad.

9. The integrated circuit packaging substrate of claim 1, wherein the top surface of the main body is substantially level with the top surface of the second conductive line.

10. A manufacturing method of a semiconductor package, the method comprising:
  determining a first spacing between a protrusion pad on at least one first conductive line of an integrated circuit (IC) packaging substrate of the semiconductor package and a second conductive line of the IC packaging substrate in accordance with a process deviation of the protrusion pad, a width of the protrusion pad, and a width of the first conductive line;
  forming the first and second conductive lines and the protrusion pad on a main body of the IC packaging substrate in accordance with at least the first spacing such that an orthogonal projection of the protrusion pad on the main body is spaced from the second conductive line after formation; and
  bonding a semiconductor chip of the semiconductor package to the IC packaging substrate, such that a solder portion of the semiconductor chip is in electrical contact with the protrusion pad of the IC packaging substrate, and a top surface of the second conductive line is exposed and substantially level with a top surface of the main body.

11. The manufacturing method of the semiconductor package of claim 10, further comprising:
  measuring a pitch P between at least two of the first conductive lines and a second spacing D between the second conductive line and one of the first conductive lines; and
  judging the pitch P and the second spacing D to substantially satisfy one of the following inequalities:

$$D \geq P/4 \text{ or } 10 \text{ }\mu m \leq D < P/4.$$

12. The manufacturing method of the semiconductor package of claim 11, wherein when D≥P/4, the manufacturing method further comprises:
  determining a width A of the protrusion pad and a width B of each of the first conductive lines to substantially satisfy the following inequality:

$$0 < A/B \leq 0.75.$$

13. The manufacturing method of the semiconductor package of claim 12, further comprising:
  using the determined width A and the determined width B to respectively form the protrusion pad and the first conductive lines.

14. The manufacturing method of the semiconductor package of claim 11, wherein when 10 μm≤D<P/4, the manufacturing method further comprises:
  determining a width A of the protrusion pad and a width B of each of the first conductive lines to substantially satisfy the following inequality:

$$0 < A/B \leq 0.45.$$

15. The manufacturing method of the semiconductor package of claim 14, further comprising:
  using the determined width A and the determined width B to respectively form the protrusion pad and the first conductive lines.

16. The manufacturing method of the semiconductor package of claim 10, wherein forming the first and second conductive lines, and the protrusion pad on the main body of the IC packaging substrate further comprises:
  performing a photolithography process on the first and second conductive lines, and the protrusion pad.

17. The manufacturing method of the semiconductor package of claim 10, wherein bonding the semiconductor chip to the IC packaging substrate comprises:
  performing a reflow treatment on the semiconductor chip and the IC packaging substrate.

18. An integrated circuit packaging substrate, comprising:
  a main body having a top surface;
  a plurality of conductive lines having non-intercepting segments that extend substantially along a first direction, the plurality of conductive lines embedded in the main body and exposed at the top surface at a pitch to enable lateral electrical connection along the top surface of the main body; and
  a plurality of protruding pads alternatingly disposed on every other one of the conductive lines along a second direction substantially normal to the first direction, the plurality of protruding pads arranged to interface a solder connector to enable vertical electrical connection with a stacking semiconductor chip, wherein the conductive lines and the protruding pads thereon have substantially equal widths.

19. The integrated circuit packaging substrate of claim 18, wherein the top surface of the main body is substantially level with top surfaces of the conductive lines.

20. The integrated circuit packaging substrate of claim 18, wherein the main body has a plurality of grooves accommodating the conductive lines, and bottom surfaces of the grooves form interfaces with bottom surfaces of the conductive lines.

* * * * *